United States Patent [19]
Yamada et al.

[11] Patent Number: 5,323,016
[45] Date of Patent: Jun. 21, 1994

[54] FOCUSING METHOD

[75] Inventors: Yuichi Yamada, Kawasaki; Yoshiharu Kataoka, Yokohama; Hiroyoshi Kubo, Kiyose; Haruna Kawashima, Kawasaki, all of Japan

[73] Assignee: Canon Kabushiki Kaisha, Tokyo, Japan

[21] Appl. No.: 82,159

[22] Filed: Jun. 28, 1993

Related U.S. Application Data

[63] Continuation of Ser. No. 652,502, Feb. 8, 1991, abandoned.

[30] Foreign Application Priority Data

Feb. 9, 1990 [JP] Japan .................. 2-028497

[51] Int. Cl.$^5$ .............................. H01L 21/00
[52] U.S. Cl. ...................... 250/561; 356/401
[58] Field of Search ............... 250/561, 548; 356/400, 356/401

[56] References Cited
U.S. PATENT DOCUMENTS

| | | | |
|---|---|---|---|
| 4,723,845 | 2/1988 | Mizertanie t al. | 250/561 |
| 4,780,616 | 10/1988 | Nishi et al. | 356/400 |
| 4,952,815 | 8/1990 | Nishi | 356/400 |
| 5,118,957 | 6/1992 | Kawashima et al. | 250/561 |

FOREIGN PATENT DOCUMENTS 2-102518  4/1990  Japan .

*Primary Examiner*—Paul M. Dzierzynski
*Assistant Examiner*—Richard Hanig
*Attorney, Agent, or Firm*—Fitztpatrick, Cella, Harper & Scinto

[57] ABSTRACT

A method of bringing a surface of a wafer into coincidence with an image plane of a projection optical system on the basis of the detection of the deviation of the wafer surface from a reference plane of a deviation detecting sensor, includes the steps of: moving the wafer surface along an optical axis of the projection optical system, to a position close to the reference plane; detecting a deviation of the wafer surface from the reference plane; and moving the wafer surface on the basis of the detection, to be brought into coincidence with the image plane of the projection optical system.

35 Claims, 5 Drawing Sheets

FOCUSING METHOD

This application is a continuation of application Ser. No. 07/652,502, filed Feb. 8, 1991, now abandoned.

FIELD OF THE INVENTION AND RELATED ART

This invention relates to a focusing method and, more particularly, to a focusing method for bringing the surface of a wafer into coincidence with an image plane of a projection optical system.

In projection exposure apparatuses for the manufacture of semiconductor devices, such as a step-and-repeat type projection exposure apparatus (called a "stepper") having a reduced-magnification projection lens system, in order to assure accurate transfer of an image of a circuit pattern onto a wafer, it is necessary to bring the surface of a wafer into exact coincidence with an image plane of a projection optical system such as a projection lens system.

This is called a "focusing operation" and, to this end, conventionally, optical type surface position detecting sensor means or air-type surface position detecting sensor means is used. With such means, any deviation of the surface of a wafer from a reference plane of the sensor means is detected and, after correcting any inclination of the wafer surface while it is kept at the site where the deviation is detected, the wafer is moved along an optical axis of a projection lens system to shift the wafer surface position to an image plane of the projection lens system.

With recent further miniaturization of circuit patterns, the numerical aperture (NA) of a projection lens system is increasing and, as a result, the depth of focus is decreasing extraordinarily. This necessitates further enhancement of the precision of coincidence of the wafer surface with the image plane of the projection lens system. With the conventional focusing method such as described above, if the surface of the wafer is displaced largely from the reference plane of the sensor means, it is not easy to assure the desired precision of coincidence.

SUMMARY OF THE INVENTION

It is accordingly a primary object of the present invention to provide an improved method of bringing the surface of a wafer into coincidence with an image plane of a projection optical system.

In accordance with a first aspect of the present invention, to achieve this object, there is provided a method of bringing a surface of a wafer into coincidence with an image plane of a projection optical system on the basis of detection of a deviation of the wafer surface from a reference plane of a deviation detecting sensor, wherein the wafer surface is moved along an optical axis of the projection optical system, to a position close to the reference plane, a deviation of the wafer surface from the reference plane, as the wafer surface is at the position, is detected; and the wafer surface is then moved on the basis of the detection, to be brought into coincidence with the image plane of the projection optical system.

In accordance with a second aspect of the present invention, there is provided a method of bringing a surface of a wafer into coincidence with an image plane of a projection optical system on the basis of the detection of a deviation of the wafer surface from a reference plane of a deviation detecting sensor, wherein the wafer surface is moved to a position close to the reference plane, a deviation of the wafer surface from the reference plane, as the wafer surface is at the position, is detected, and any inclination of the wafer surface is corrected in accordance with the detected deviation.

In accordance with a third aspect of the invention, there is provided a method of bringing a surface of a wafer into coincidence with an image plane of a projection optical system on the basis of the detection of deviations of the wafer surface, at different points thereon, from a focal plane of a deviation detecting optical sensor, wherein the wafer surface is moved to a position close to the focal plane of the optical sensor, deviations at the different points of the wafer surface from the focal plane, as the wafer surface is at the position, are detected, and any inclination of the wafer surface is corrected in accordance with the detected deviations.

In the present invention, irrespective of the large distance of the wafer surface from the reference plane or the focal plane of the sensor, the wafer surface may be first brought to a position very close to the reference plane or the focal plane and, at that position, any deviation of the wafer surface may be measured. Accordingly, it is possible to obtain information on the deviation of the wafer surface with good precision. This makes it possible to correct the wafer surface position or inclination very accurately and, therefore, to bring the wafer surface into exact coincidence with the image plane of the projection optical system.

In the second and third aspects, correction of the inclination and the coincidence with the image plane may be effected substantially simultaneously, thereby reducing the time for performing these operations.

The present invention is effective when applied to a focusing operation for projection exposure in the manufacture of semiconductor devices, and from this point, a semiconductor device manufacturing method is provided by the present invention.

Thus, in accordance with a fourth aspect of the present invention, there is provided a method of manufacturing semiconductor devices by bringing a surface of a wafer into coincidence with an image plane of a projection optical system on the basis of the detection of a deviation of the wafer surface from a reference plane of a deviation detecting sensor and by projecting an image of a circuit pattern upon the wafer through the projection optical system, wherein the wafer surface is moved to a position close to the reference plane, a deviation of the wafer surface from the reference plane, as the wafer surface is at the position, is detected, and any inclination of the wafer surface is corrected in accordance with the detected deviation.

In accordance with a fifth aspect of the invention, there is provided a method of manufacturing semiconductor devices by bringing a surface of a wafer into coincidence with an image plane of a projection optical system on the basis of the detection of deviations of the wafer surface, at different points thereon, from a focal plane of a deviation detecting optical sensor, and by projecting an image of a circuit pattern upon the wafer surface through the projection optical system, wherein the wafer surface is moved to a position close to the focal plane of the optical sensor, deviations at the different points of the wafer surface from the focal plane, as the wafer surface is at the position, are detected, and any inclination of the wafer surface is corrected in accordance with the detected deviations.

In accordance with a sixth aspect of the invention, there is provided a method of manufacturing semiconductor devices by detecting deviations of different surface zones of a wafer from a reference plane of a sensor and by projecting an image of a circuit pattern sequentially onto the surface zones of the wafer through a projection optical system while sequentially bringing the surface zones of the wafer into coincidence with an image plane of the projection optical system in accordance with the detected deviations, wherein a first surface zone of the wafer is brought into coincidence with the image plane of the projection optical system and then the image of the circuit pattern is projected upon the first surface zone through the projection optical system, wherein, after the image projection to the first surface zone, a second surface zone of the wafer, adjacent to the first surface zone, is moved to a position close to the reference plane of the sensor, a deviation of the second surface zone from the reference plane, as the second surface zone is at the position, is detected, and the second surface zone is brought into coincidence with the image plane of the projection optical system, on the basis of the detection.

In an initial state, the image plane may be so set that it substantially coincides with the reference plane, ,or the focal plane. In a different state, it may deviate from the reference plane or the focal plane due to a change in pressure or a change in temperature of the projection optical system, for example, caused by the application of optical energy, for example. Thus, in the latter state, the wafer surface may be moved in accordance with the quantity of deviation of the image plane with respect to the reference plane or the focal plane.

When the image plane deviates from the reference plane or focal plane, first the wafer surface may be brought into substantial coincidence with the reference plane or the focal plane and, thereafter, the wafer may be displaced. Alternatively, the inclination of the wafer may be corrected while displacing the wafer directly to the image plane from the reference plane or the focal plane.

Where the wafer surface is to be displaced to a position close to the reference plane or the focal plane, first the wafer surface position may be detected by using the sensor means and the wafer displacement may be made in accordance with the detection. As for the sequence, the wafer displacement may be made on the basis of the initial detection only or, alternatively, the wafer displacement may be made while sequentially detecting the wafer surface position. Such two types of sequences may be applied to the movement of the wafer to the image plane from the reference plane or the focal plane. Also, for such displacement, a sensor means other than that described, such as one that does not use the wafer surface, may be used.

In the present invention, any one of optical type surface position detecting sensor means, air type surface position detecting sensor means, as well as other types of sensor means, may be used. The reference plane or the focal plane may be set substantially at the center of a measurement range of a used sensor means.

When an air type surface position detecting sensor means is used, air may be blown against different points around an exposure zone (shot area) on a wafer. By measuring at each point the surface position, i.e., any deviation from the reference plane of the sensor means, it is possible to detect the height and inclination of the exposure zone.

When an optical type sensor means is used, in one form, a plurality of light beams may be inputted obliquely to the central point of an exposure zone of a wafer and some points around it. By using reflected light beams from these points, it is possible to measure the surface positions at these points, i.e., any deviation of the zone surface from the reference plane of the sensor means and, therefore, it is possible to detect the height and inclination of the zone surface. In another form, a light beam may be projected to the center of the exposure zone, so as to measure deviation (height) of the zone surface from the reference plane on the basis of a reflected light beam therefrom while, on the other hand, another light beam, preferably a parallel light beam may be projected to illuminate the whole exposure zone so as to detect any inclination of the zone surface on the basis of a reflected light beam therefrom.

The reference plane of an optical type sensor means may preferably be set at its focal plane. Such a focal plane may be set in a plane on which each or the light beam is focused. Alternatively, it may be set in a plane which is perpendicular to an optical axis of the projection optical system and which is substantially optically conjugate with a light receiving surface of the sensor means.

The correction of inclination of the zone surface may be effected by, for example, using three piezoelectric devices for supporting a wafer stage (on which a wafer is to be placed) at three points and by actuating these piezoelectric devices. However, any one of other types of actuators may be used. These actuators may be used also for displacing the zone surface along the optical axis of the projection optical system. As a matter of course, a separate actuator means may be used for this purpose.

When the wafer surface is to be displaced to the reference plane or the focal plane of the sensor means, the wafer may be moved along the optical axis of the projection optical system or, alternatively, the reference plane or the focal plane may be shifted along the optical axis of the projection optical system. Similarly, for coincidence of the wafer surface with the image plane, the wafer may be moved along the optical axis of the projection optical system or, alternatively, the image plane may be shifted along the optical axis of the projection optical system.

When the present invention is applied to a stepper, the focusing operation according to any one of these aspects as well as the exposure operation may be repeated sequentially to different exposure zones arrayed regularly on a wafer.

When the present invention is applied to a stepper, one feature may reside in that, even if each of the zone surfaces arrayed on a wafer is between the image plane and the measurement reference plane or it is at a side of the image plane remote from the reference plane, each zone surface of the wafer may be once moved to a position close to the reference plane. With this sequence, it is possible to assure exact coincidence of each zone surface with the image plane.

Where an offset determined for compensation of a detection error attributable to a pattern or a resist on a wafer substrate, is used in the detection of deviation of the wafer surface from the reference plane or the focal plane of the sensor means, it is possible to enhance the exactness of coincidence of the wafer surface with the image plane. If this is desired, the offset may be determined beforehand with respect to a case where the wafer surface is set at a position close to the reference plane or the focal plane.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
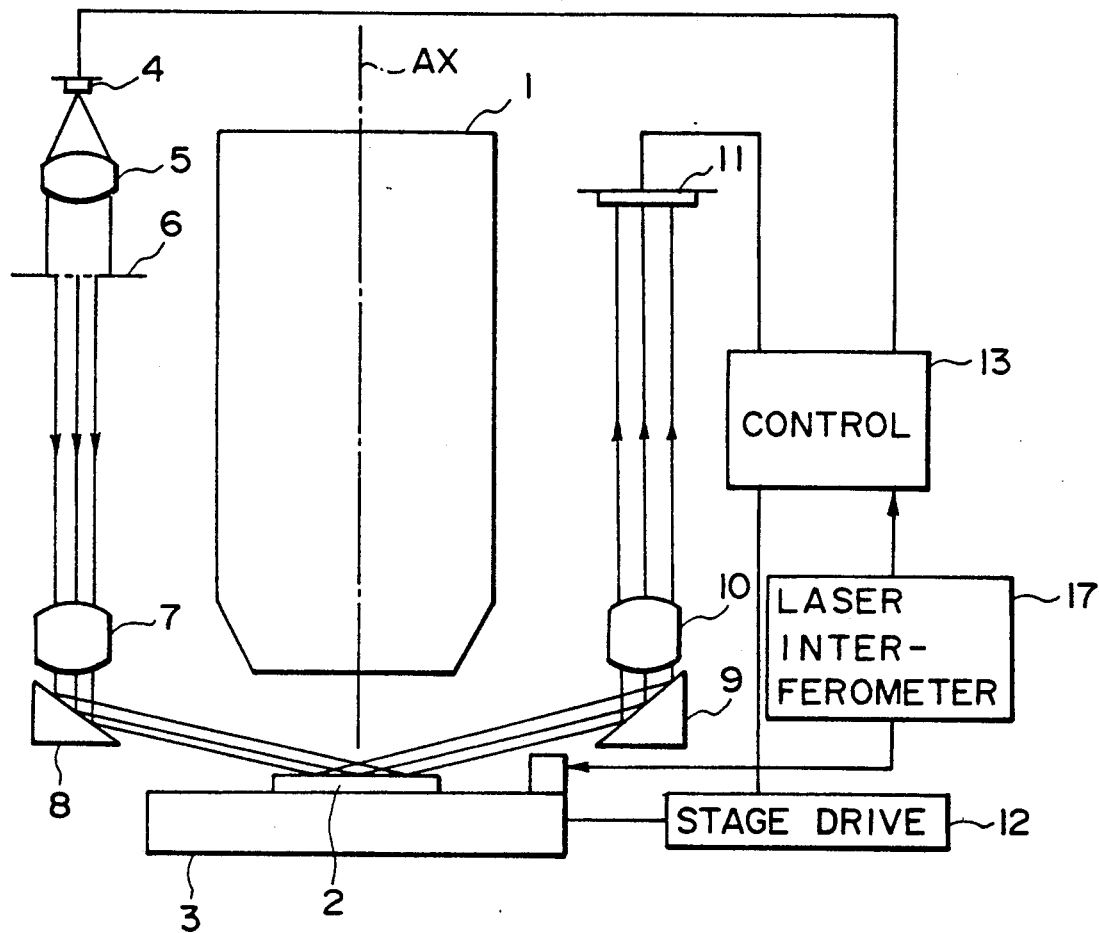
FIG. 1 is a partial diagrammatic view of a reduction projection exposure apparatus having an automatic focus adjustment control system according to an embodiment of the present invention.

FIG. 1 is a partial diagrammatic view of a reduction projection exposure apparatus having an automatic focus adjustment control system according to an embodiment of the present invention.

In FIG. 1, denoted at 1 is a reduction projection lens system having an optical axis AX. The reduction projection lens system 1 serves to project an image of a circuit pattern of a reticle (not shown), in a reduced scale of 1:5 or 1:20, to form that image on its image plane. The optical axis AX is parallel to the Z axis as illustrated. Denoted at 2 is a wafer coated with a resist, on which a number of exposure zones (shot areas) are defined in an array. Each exposure zone has a pattern formed through the preceding exposure process. Denoted at 3 is a wafer stage for carrying thereon the wafer 2, and the wafer 2 is held to the wafer stage 3 by attraction. The wafer stage 3 comprises an X stage movable in the X-axis direction, a Y stage movable in the Y-axis direction and a Z stage which is movable in the Z-axis direction and is rotatable about each of axes parallel to the X, Y and Z axes. The X, Y and Z axes are perpendicular to each other. With this arrangement, by moving the wafer stage 3, it is possible to adjust the position of the wafer 2 surface with respect to the direction of the optical axis AX of the reduction projection lens system 1 and in a plane perpendicular to the optical axis AX. Additionally, it is possible to adjust any inclination of the wafer 2 surface with respect to the image of the circuit pattern, i.e., the image plane of the projection lens system.

Figure 4:
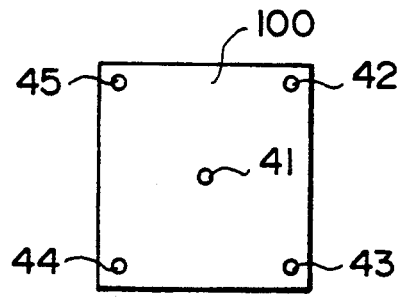
FIG. 4 is a schematic view, for explaining positional relationship of measuring points with respect to an exposure zone.

Reference numerals 4–11 in FIG. 1 denote components of a detection optical system (surface position detecting sensor means) provided to detect the position and inclination of the wafer 2 surface. Denoted at 4 is a high-luminance light source such as a light emitting diode or a semiconductor laser, for example, and denoted at 5 is an illumination lens. Light emanating from the light source 4 is transformed by the illumination lens into substantially parallel light which irradiates a mask 6 in which a plurality of pinholes are formed. Plural light beams passing through the pinholes of the mask 6, respectively, go through an imaging lens 7 and impinge on a deflecting mirror 8. After deflection by the deflecting mirror 8, the light beams are obliquely incident upon the wafer 2 surface. The imaging lens 7 and the deflecting mirror 8 serve to form an image of each pinhole upon a focal plane of the detection optical system, i.e., a reference plane for the measurement. As shown in FIG. 4, these light beams illuminate five points (41–45) including the center of an exposure zone 100 of the wafer 2, and the light beams are reflected at these points, respectively. Namely, in this embodiment, the mask 6 has five pinholes and, with respect to five points in the exposure zone 100 including the center thereof, the surface position measurement is made.

The light beams reflected by respective measuring points on the wafer 2 are deflected by another deflecting mirror 9 and, after passing through a detection lens 10, they are incident upon a two-dimensional position detecting element 11. Here, when the exposure zone 100 is close to the focal plane of the detection optical system, the detection lens 10 cooperates with the imaging lens 7, the deflecting mirror 8, the wafer 2 and the deflecting mirror 9, to form images of the pinholes of the mask 6 upon the two-dimensional position detecting element 11. Thus, in this case, the mask 6, the wafer 2 and the two-dimensional position detecting element 11 are at those positions which are substantially optically conjugate with each other.

The two-dimensional position detecting element 11 comprises a CCD sensor, for example, and it serves to detect the position of incidence of plural lights upon the light receiving surface thereof, independently of each other. Any change in the position of the wafer 2 with respect to the optical axis AX direction of the reduction projection lens system 1 can be detected as a displacement, from a certain position, of the position of incidence of each of the plural lights upon the two-dimensional position detecting element 11. Therefore, with respect to each of the five measuring points 41–45 in the exposure zone 100 on the wafer 2, it is possible to detect the position of the wafer 2 surface in the optical axis AX direction of the projection lens system 1. The output signal from the two-dimensional position detecting element 11 is inputted to a control means 13 through a signal line.

Displacement of the wafer stage 3 in the X-axis and Y-axis directions is measured in a well-known manner by using a laser interferometer 17 and another laser interferometer (not shown), and signals representing the quantity of displacement of the wafer stage 3 are applied from the laser interferometers to the control means 13 by way of signal lines. Also, the movement of the wafer stage 3 is controlled under the influence of a stage driving device 12 which is adapted to receive an instruction signal supplied from the control means 13 through a signal line and to drive the wafer stage 3 in response to the received signal. The stage driving device 12 includes first driving means and second driving means. The former serves to adjust the rotation ($\theta$) and the position (x, y) of the wafer 2 in a plane perpendicular to the optical axis AX of the projection lens system. The latter serves to adjust the inclination ($\phi_{x,y}$) and the position (z) of the wafer 2 with respect to the optical axis AX direction.

The control means 13 serves to process the output signal from the two-dimensional position detecting element 11, in a known manner such as disclosed in Japanese Laid-Open Patent Application No. 2-102518, to detect the position of the wafer 2 surface. On the basis of the result of detection, it applies a corresponding instruction signal to the stage driving device 12. In response to this instruction signal, the second driving means of the stage driving device 12 operates to adjust the inclination and position of the wafer 2 with respect to the optical axis AX direction.

Figure 2:
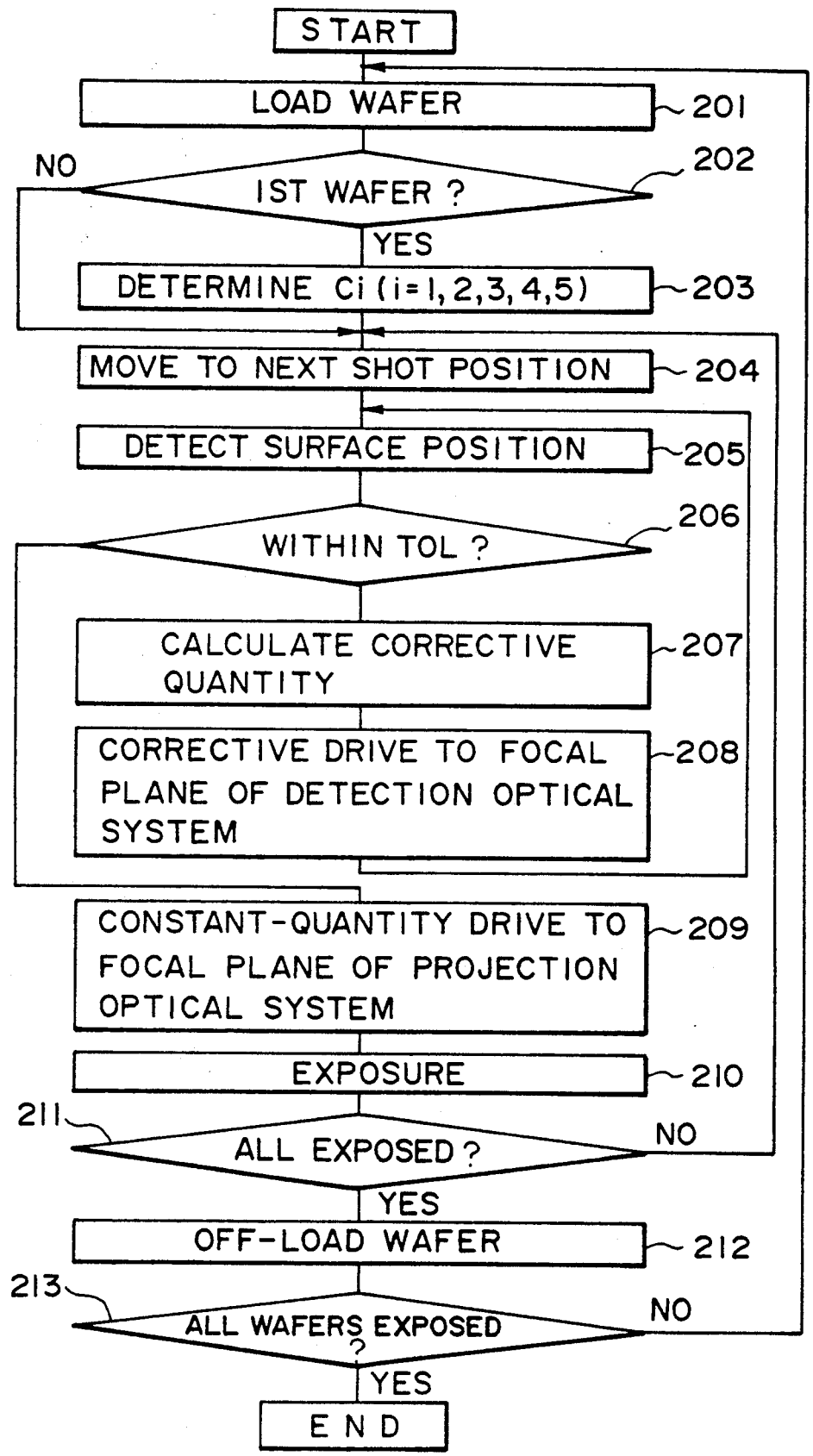
FIG. 2 is a flow chart showing an example of the operation of the exposure apparatus of FIG. 1.

Referring to the flow chart of FIG. 2, the operation of the exposure apparatus according to the present embodiment will be explained. First, at step 201, a wafer 2 is loaded on the wafer stage 3 and, at step 202, a discrimination is made as to whether the introduced wafer is the first wafer or not. If it is the first wafer, at step 203, a function on the surface shape of the wafer 2 is determined in accordance with a known method such as disclosed in the aforementioned Japanese Laid-Open Patent Application, and constant terms $C_i$ ($i=1$ to 5) thereof is detected and stored in a memory of the control means 13, as an offset. If the wafer is not the first wafer, the sequence goes directly to step 204.

At step 204, the wafer stage 3 is moved in the X-axis and Y-axis directions so that the next exposure zone on the wafer 2 (if it is the first time, the first exposure zone) is placed just underneath the reduction projection lens system 1, and the exposure zone, concerned, is aligned with the circuit pattern of the reticle.

Subsequently, at steps 205-208, the surface position adjustment, i.e., the focusing operation for bringing the surface of the exposure zone into coincidence with the image plane of the projection lens system 1, is effected. More specifically, first at step 205, the detection optical system (4-11) is used to execute the surface position measurement with respect to five measuring points (41-45) and, on the basis of the output signal from the two-dimensional position detecting element 11, the surface position data at each measuring point is prepared within the control device 13. The control device 13 reads out the offsets $C_i$ ($i=1-5$) from its memory and five surface position data of the exposure zone, concerned, by using corresponding offsets, to thereby prepare five fresh (true) surface position data. Then, on the basis of the five corrected surface position data, the control device 13 determines a least square plane of the exposure zone 100, concerned, and calculates the degree of coincidence of the least square plane with a certain reference plane, that is, the focal plane of the detection optical system in this example. The focal plane is parallel to the image plane of the projection lens system, and the constant terms $C_i$ ($i=1-5$) are set with reference to this focal plane of the detection optical system. Therefore, for correct reflection of the offset, in this embodiment, the exposure zone 100 is moved to a position close to the focal plane of the detection optical system and, after the zone reaches that position, the surface position measurement is executed.

Subsequently, at step 206, a discrimination is made as to whether the calculated degree of coincidence is within a certain tolerance or not. If so, the sequence goes to step 209. If not, the quantity of correction is calculated at step 207 and, at step 208, the control device 13 applies an instruction signal corresponding to the result of calculation to the stage driving device 12. In response, the stage driving device operates to adjust (correct) the inclination and the position of the wafer stage 2 with respect to the optical axis AX direction of the projection lens system 1. Then, the sequence goes back to step 205 and the surface position detection is repeated. In this manner, the wafer 2 surface, more particularly, the surface of the exposure zone 100 is positioned to the focal plane of the detection optical system and the surface position data corresponding to an output signal from the detection optical system as the exposure zone 100 surface is positioned is corrected by using an offset. As a result of this, the offset $C_i$ ($i=1-5$) stored in the memory of the control device 13 correctly reflects the surface position. Accordingly, an error in the measurement of the surface position can be minimized.

After the adjusted surface position comes within the tolerance, at step 209, a constant quantity or a predetermined quantity of corrective drive is executed which quantity corresponds to the quantity and direction of inclination of the exposure zone 100, concerned, with respect to the image plane as well al the interval between the image plane of the projection lens system 1 and the exposure zone 100, concerned, with respect to the optical axis AX direction as having been predetected on the basis of calculation and/or experiments. Such corrective drive is effected in accordance with an open-loop sequence. By this, the wafer 2 surface, more particularly, the surface of the exposure zone 100 can be positioned exactly in the image plane of the reduction projection lens system 1.

After the re-adjustment of the surface position, at step 210, the exposure zone 100 concerned is exposed to the image of the circuit pattern, whereby the circuit pattern image is printed thereon. At step 211, a discrimination is made as to whether the exposures of all the shot areas (exposure zones) are completed or not. If not completed, the sequence goes back to step 204 and the wafer stage 3 is moved in the X-axis and Y-axis directions so that the next exposure zone (e.g. adjacent exposure zone) on the wafer 2 is placed just underneath the reduction projection lens system 1. Then, the surface position detection operation, the surface position adjusting operation and the exposure operation (steps 205-210) described above are repeated. If the exposures of all the shot areas are completed, at step 212 the wafer is off-loaded and, at step 212 a discrimination is made as to whether all the wafers are processed or not. If not, the sequence goes back to step 201, and a next wafer is loaded and the above-described steps are repeated. If all the wafers are processed, the exposure process is finished. After the exposure process, various processes such as development, etching and the like are executed to each off-loaded wafer and, finally, semiconductor devices are manufactured.

In this embodiment, for each exposure zone, measurement of the surface position and corrective drive for that exposure zone to the focal plane of the detection optical system as well as drive therefor to the image plane of the projection lens system, are executed. However, in consideration of the throughput, during the stepwise movement of the wafer stage to be made between adjacent shot areas, a predetermined quantity of corrective drive may be made from the image plane of the projection lens system toward the focal plane of the detection optical system.

Figure 3:
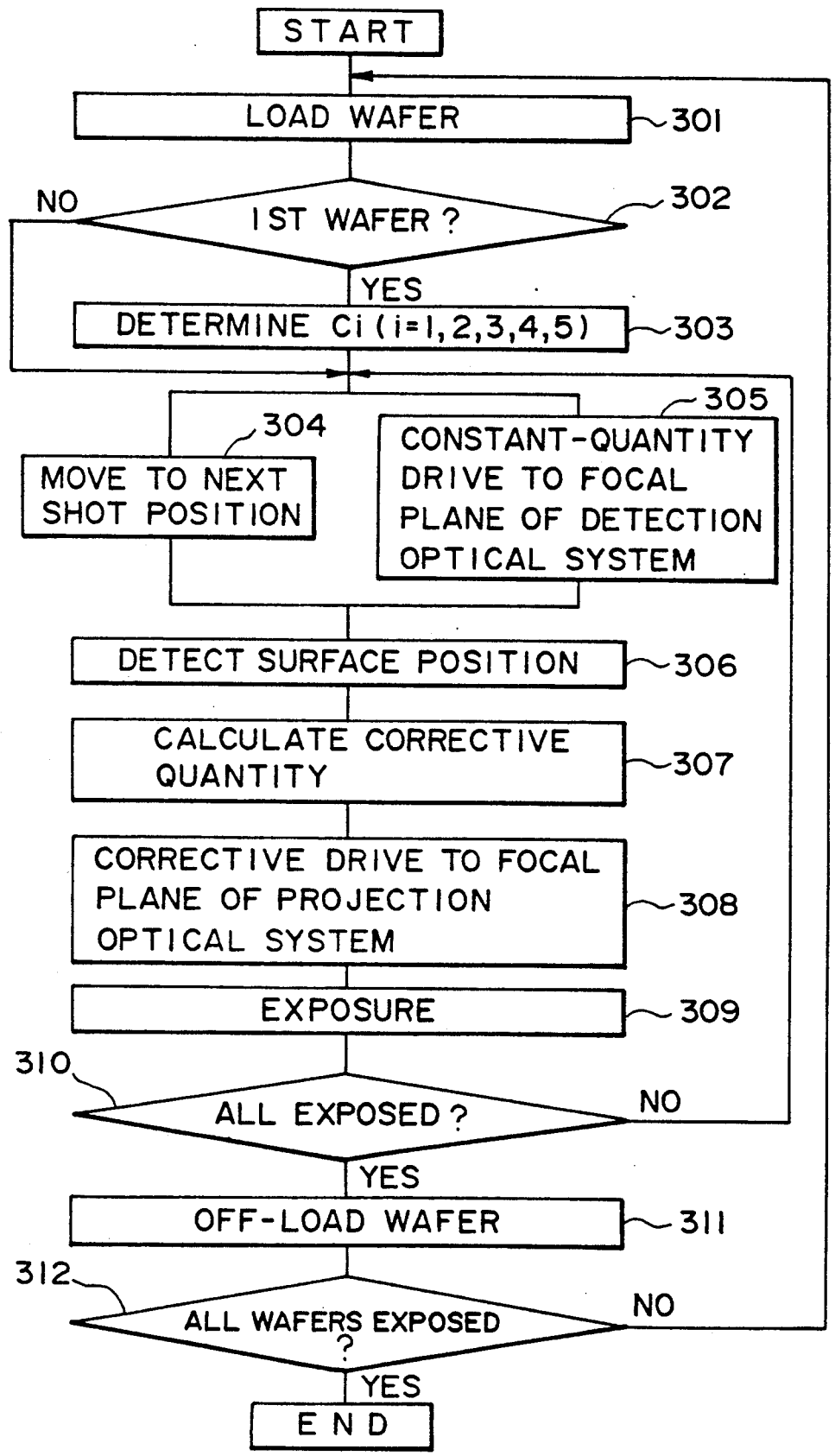
FIG. 3 is a flow chart showing another example of the operation of the exposure apparatus of FIG. 1.

That is, as shown in the flow chart of FIG. 3, after completion of exposure of an n-th shot area and during the stepwise movement for allowing exposure of an (n+1)-th shot area to be made at step 304, the interval between the focal plane of the detection optical system and the image plane of the projection optical system with respect to the optical axis AX direction as well as the quantity and direction of inclination of the wafer 2 (having been adjusted by the predetermined quantity of corrective drive to the n-th shot area) are recovered through an open-loop sequence (step 305). As a result, at the (n+1)-th shot, the corresponding exposure zone surface initially substantially coincides with the focal plane of the detection optical system and, consequently, accurate surface position measurement through the optical system (step 306) is assured. On the basis of surface position data obtainable at this position and corrected with the offset, correction is added to the predetermined-quantity drive to the image plane of the projection lens system 1, used earlier, and the positioning of the surface of that exposure zone to the image plane of the projection lens system 1 (steps 307 and 308) is executed through an open-loop sequence. Steps 301-303 as well as steps 309-312 are similar to steps 201-203 and steps 210-213 of FIG. 2.

In another modified form, for moving an exposure zone surface to the image plane of the projection lens system, enhancement of driving precision may be possible by using a separate measuring means such as an eddy-current displacement gauge, for example, which is independent of the wafer surface position measuring means (detection optical system) and which is adapted to monitor the drive quantity of the driving system itself, so at to execute that movement through a closed loop.

Figure 5:
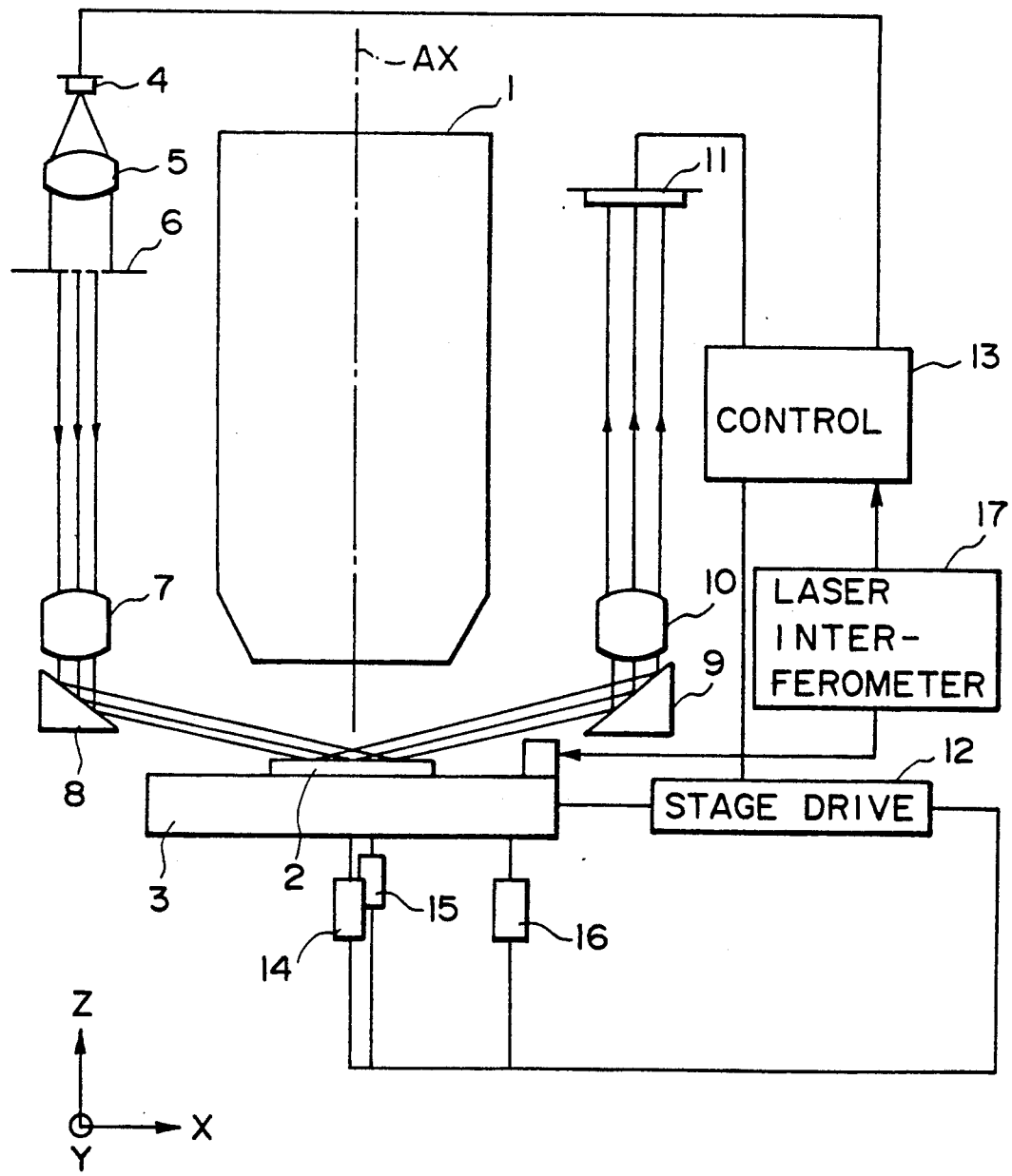
FIG. 5 is a partial diagrammatic view of a reduction projection exposure apparatus having an automatic focus adjustment control system according to another embodiment of the present invention.

FIG. 5 is a partial diagrammatic view of a reduction projection exposure apparatus of such an embodiment. This embodiment differs from the FIG. 1 embodiment in that eddy-current displacement gauges 14, 15 and 16 are added to the Z-stage of the wafer stage 3, which is rotationally movable about each of the axes parallel to the Z-axis direction as well as the X-axis and Y-axis directions.

Figure 6:
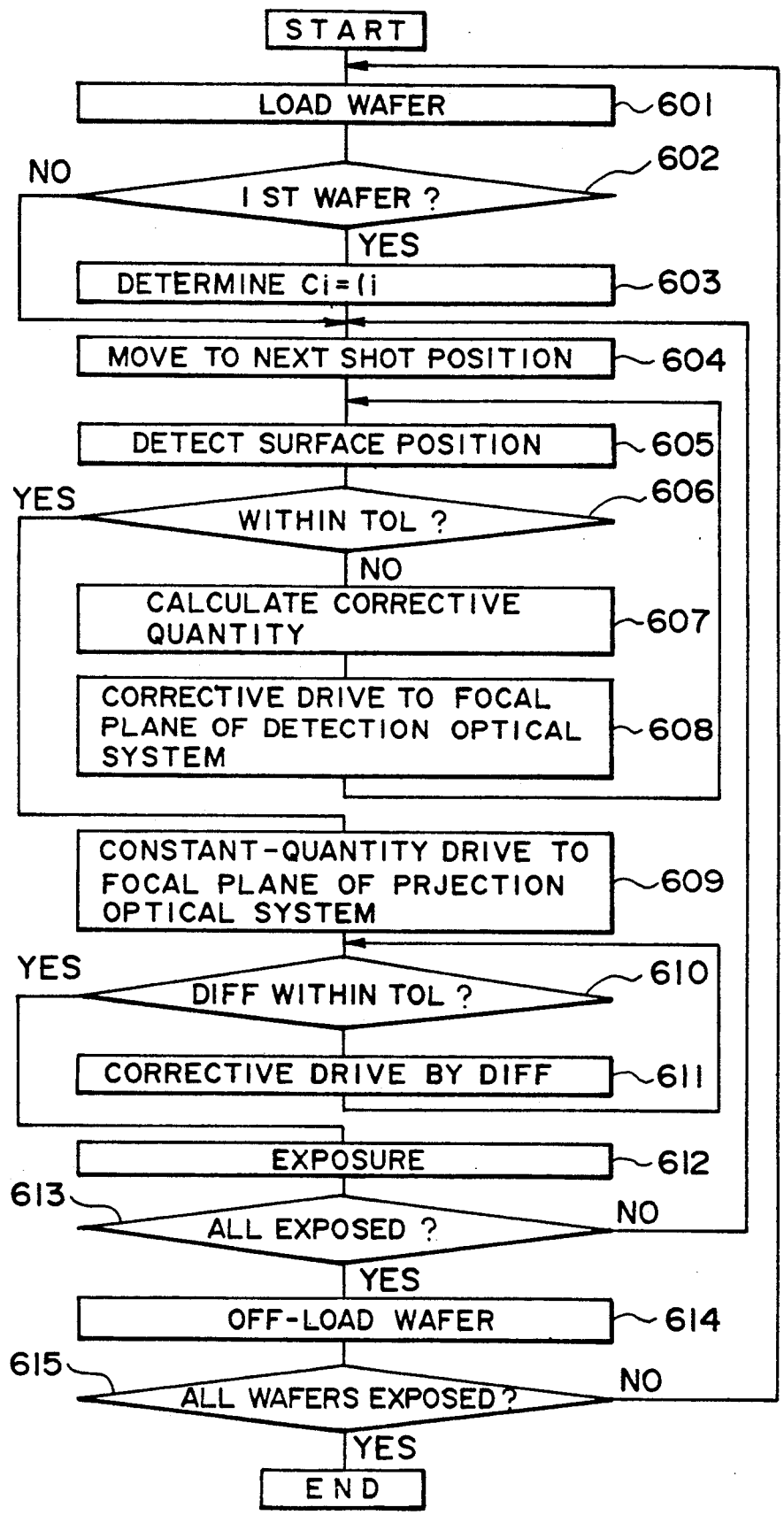
FIG. 6 is a flow chart showing an example of the operation of the exposure apparatus of FIG. 5.

In this example, as shown in the flow chart of FIG. 6, the sequence up to the positioning of a first exposure zone of a wafer 2, placed just below the reduction projection lens system 1, to the focal plane of the detection optical system (i.e. steps 601-608), may be effected in accordance with the flow chart of FIG. 2 (steps 201-208). After the surface position comes into the tolerance as a result of such surface position adjustment, at step 609, a signal of predetermined-quantity corrective drive corresponding to the quantity and direction of inclination of the wafer 2 with respect to the image plane as well as the spacing to the image plane of the projection lens system 1 with respect to the optical axis AX direction, having been predetected on the basis of calculation and/or experiments, is supplied from the control device 13 to the stage driving device 12. In response, the stage driving device 12 moves the Z-stage of the wafer stage 3. Additionally, at steps 610 and 611, it continues the drive while reading the displacements of the eddy-current displacement gauges 14-16 until the designated quantity of corrective drive is accomplished. By this, the first exposure zone is positioned in the image plane of the reduction projection lens system 1. The sequence following this (i.e., steps 612-615) is similar to that of the FIG. 2 flow chart (steps 210-213). It is to be noted here that, in the method shown in the flow chart of FIG. 2, like the present embodiment, the coincidence of the exposure zone surface with the image plane may be discriminated on the basis of the detection of the surface position by using the detection optical system, for example.

In the embodiments described hereinbefore, the surface position measurement of each exposure zone is executed as that exposure zone is at a position very close to a reference plane of a measuring sensor, such as the focal plane of a detection optical system, for example. This assures automatic focus adjustment with minimum measurement error.

Thus, when the present invention is applied to an exposure method and apparatus for the manufacture of semiconductor devices, it is possible to surely position every exposure zone surface of a wafer within the depth of focus of a reduction projection lens system, regardless of a decrease in the depth of focus of the reduction projection lens system attributable to an increase in the degree of integration of a VLSI (very large scaled integrated circuit) or regardless of enlargement of the size of each exposure zone. As a result, there is a significant advantage of assuring accurate transfer of a circuit pattern and ensuring the manufacture of higher-integration microcircuit devices.

In the present embodiment, in place of the optical type surface position detecting sensor means described above, air type surface position detecting sensor means or other sensor means may be used. Preferably, the reference plane for measurement such as the focal plane as described above is set substantially at the center position of the measurement range of the sensor means.

When an air-type surface position detecting sensor means is used, air may be blown against different points around an exposure zone 100 on a wafer and, the surface position at each point, i.e., a deviation from the reference plane of the sensor means may be measured to determine the height and inclination of the exposure zone 100. In another form, an optical type surface position detecting sensor means may be such that: a light beam is projected to the wafer so that it is focused at the center of an exposure zone and, on the basis of the position of incidence of a reflected light beam therefrom upon a light receiving surface, a deviation (height) of that exposure zone 100 surface from the reference plane is measured. On the other hand, another light beam, preferably, a parallel light beam, is projected to the whole exposure zone 100 and parallel reflection beam therefrom is collected upon the light receiving surface. On the basis of the position of incidence of that light beam upon the light receiving surface, any inclination of the exposure zone 100 can be detected.

The inclination of the exposure zone 100 can be corrected by using three piezoelectric devices, for example, which support a wafer holding a Z-stage at three points and by actuating these piezoelectric devices. However, any other types of actuators may be used. Also, these actuators may be used to displace the exposure zone surface along the optical axis AX of the projection lens system. As a matter of course, separate actuator means may be used therefor.

In the foregoing embodiments, for displacement of the wafer 2 surface to the focal plane of the detection optical system, the wafer 2 is moved along the optical axis AX of the projection lens system 1. However, in place of it, the detection optical system may be moved to shift the focal plane along the optical axis AX of the projection lens system 1. Similarly, moving the wafer 2 along the optical axis AX of the projection optical system 1 for bringing the wafer 2 surface into coincidence with the image plane, may be replaced by changing the power of the projection lens system 1 or by moving the projection lens system 1 so as to shift the image plane thereof along the optical axis AX thereof.

Generally, a projection lens system 1 is so that, at an initial state, the image plane thereof coincides or substantially coincides with the reference plane of a measuring means such as the focal plane of a detection optical system. However, due to a change in pressure or a change in temperature of the projection optical system attributable to the application of optical energy, the image plane of the projection lens system may shift from the reference plane. In consideration thereof, if the position or deviation of the image plane is to be detected, a pressure sensor or a light quantity sensor may be used in a well-known manner. Alternatively, an image plane detector of TTL (through the lens) type may be used.

While in the foregoing embodiments the projection optical system comprises a reduction projection optical system, the magnification of the optical system is not a limitation. Further, in place of a lens system, a projection optical system having a mirror system may be used.

While the invention has been described with reference to the structures disclosed herein, it is not confined to the details set forth and this application is intended to cover such modifications or changes as may come within the purposes of the improvements or the scope of the following claims.

What is claimed is:

1. A method of bringing a surface of a wafer into coincidence with an image plane of a projection optical system on the basis of detection of a deviation of the wafer surface from a reference plane of a deviation detecting sensor, comprising the steps of:
   moving the wafer surface to a position close to the reference plane;
   detecting a deviation of the wafer surface from the reference plane;
   correcting any inclination of the wafer surface in accordance with the detected deviation; and
   moving, after said correcting step, the wafer surface along an optical axis of the projection optical system in accordance with an amount which is predetermined on the basis of the deviation of the image plane with respect to the reference plane of the deviation detecting sensor.

2. A method according to claim 1, wherein said correcting step comprises the step of bringing the wafer surface into substantial coincidence with the reference plane.

3. A method used in manufacturing semiconductor devices by bringing a surface of a wafer into coincidence with an image plane of a projection optical system on the basis of detection of a deviation of the wafer surface from a reference plane of a deviation detecting sensor and by projecting an image of a pattern upon the wafer through the projection optical system, comprising the steps of:
   moving the wafer surface to a position close to the reference plane;
   detecting a deviation of the wafer surface from the reference plane;
   correcting any inclination of the wafer surface in accordance with the detected deviation; and
   moving, after said correcting step, the wafer surface along an optical axis of the projection optical system in accordance with an amount which is predetermined on the basis of the deviation of the image plane with respect to the reference plane of the deviation detecting sensor.

4. A method according to claim 3, further comprising the step of, before attainment of coincidence of the wafer surface with the image plane, bringing the wafer surface into substantial coincidence with the reference plane.

5. A method of bringing a surface of a wafer into coincidence with an image plane of a projection optical system on the basis of detection of deviations of the wafer surface, at different points thereon, from a focal plane of a deviation detecting optical sensor, comprising the steps of:
   moving the wafer surface to a position close to the focal plane of the optical sensor;
   detecting deviations at the different points of the wafer surface from the focal plane;
   correcting any inclination of the wafer surface in accordance with the detected deviations; and
   moving, after said correcting step, the wafer surface along an optical axis of the projection optical system in accordance with an amount which is predetermined on the basis of the deviation of the image plane with respect to the focal plane of the optical sensor.

6. A method according to claim 5, wherein said correcting step comprises the step of bringing the wafer surface into substantial coincidence with the reference plane.

7. A method used in manufacturing semiconductor devices by bringing a surface of a wafer into coincidence with an image plane of a projection optical system on the basis of detection of deviations of the wafer surface, at different points thereon, from a focal plane of a deviation detecting optical sensor, and by projecting an image of a pattern upon the wafer surface through the projection optical system, comprising the steps of:
   moving the wafer surface to a position close to the focal plane of the optical sensor;
   detecting deviations at the different points of the wafer surface from the focal plane;
   correcting any inclination of the wafer surface in accordance with the detected deviations; and
   moving, after said correcting step, the wafer surface along an optical axis of the projection optical system in accordance with an amount which is predetermined on the basis of the deviation of the image plane with respect to the focal plane of the optical sensor.

8. A method according to claim 7, further comprising the step of, before attainment of coincidence of the wafer surface with the image plane, bringing the wafer surface into substantial coincidence with the reference plane.

9. A method of bringing a surface of a wafer into coincidence with an image plane of a projection optical system on the basis of detection of a deviation of the wafer surface from a reference plane of a deviation detecting sensor, comprising the steps of:
   moving the wafer surface along an optical axis of the projection optical system, to a position close to the reference plane;
   detecting a deviation of the wafer surface from the reference plane;
   moving the wafer surface on the basis of the detection, to be brought into coincidence with the reference plane of the deviation detecting sensor; and moving, after said second moving step, the wafer surface along an optical axis of the projection optical system in accordance with an amount which is predetermined on the basis of the deviation of the image plane with respect to the reference plane of the deviation detecting sensor.

10. A method according to claim 9, further comprising the step of, for attainment of the coincidence, correcting any inclination of the wafer surface with respect to the reference plane in accordance with the detected deviation.

11. A method according to claim 9, wherein, an initial state, the wafer surface is between the image plane and the reference plane or at a side of the image plane remote from the reference plane.

12. A method used in manufacturing semiconductor devices by detecting deviations of different surface zones of a wafer from a reference plane of a sensor and by projecting an image of a pattern sequentially onto the surface zones of the wafer through a projection optical system while sequentially bringing the surface zones of the wafer into coincidence with an image plane of the projection optical system in accordance with the detected deviations, wherein a first surface zone of the wafer is brought into coincidence with the image plane of the projection optical system and then the image of the circuit pattern is projected upon the first surface zone through the projection optical system, comprising the steps of:

after the image projection to the first surface zone, moving a second surface zone of the wafer, adjacent to the first surface zone, to a position close to the reference plane of the sensor;

detecting a deviation of the second surface zone from the reference plane; and bringing the second surface zone into coincidence with the reference plane of the sensor, on the basis of the detection; and moving, after said bringing step, the second surface zone along an optical axis of the projection optical system in accordance with an amount which is predetermined on the basis of the deviation of the image plane with respect to the reference plane of the sensor.

13. A method according to claim 12, further comprising the step of, for attainment of the coincidence of the second surface zone with the image plane, correcting any inclination of the second surface zone with respect to the image plane.

14. A method according to claim 13, wherein said bringing step comprises the step of moving the wafer along an optical axis of the projection optical system to displace the surface of the wafer.

15. A method according to claim 14, wherein said bringing step further comprises the step of moving the wafer along an optical axis of the projection optical system to displace the surface of the wafer, while correcting the inclination of the second surface zone.

16. A method according to claim 14, wherein said bringing step comprises the step of first bringing the second surface zone into coincidence with the reference plane of the sensor and then displacing the second surface zone along the optical axis of the projection optical system.

17. A method according to any one of claims 13–16, wherein, after the image projection onto the second surface zone, said method comprises the step of repeating the process of detecting deviation with respect to the reference plane, coincidence attainment, and image projection for the remaining surface zones of the wafer sequentially.

18. A method according to any one of claims 13–16, further comprising the steps of using the sensor to detect the deviation optically, and using a focal plane of the sensor as the reference plane.

19. A semiconductor device manufactured by a method wherein a surface of a wafer is brought into coincidence with an image plane of a projection optical system on the basis of detection of a deviation of the wafer surface from a reference plane of a deviation detecting sensor and wherein an image of a pattern is projected on the wafer through the projection optical system, said method comprising the steps of:

moving the wafer surface to a position close to the reference plane;

detecting a deviation of the wafer surface from the reference plane;

correcting any inclination of the wafer surface in accordance with the detected deviation; and moving, after said correcting step, the wafer surface along an optical axis of the projection optical system in accordance with an amount which is predetermined on the basis of the deviation of the image plane with respect to the reference plane of the deviation detecting sensor.

20. A semiconductor device manufactured by a method, wherein a surface of a wafer is brought into coincidence with an image plane of a projection optical system on the basis of detection of deviations of the wafer surface, at different points thereon, from a focal plane of a deviation detecting optical sensor and wherein an image of a pattern is projected on the wafer surface through the projection optical system, said method comprising the steps of:

moving the wafer surface to a position close to the focal plane of the optical sensor;

detecting deviations at the difference points of the wafer surface from the focal plane;

correcting any inclination of the wafer surface in accordance with the detected deviations; and moving, after said correcting step, the wafer surface along an optical axis of the projection optical system in accordance with an amount which is predetermined on the basis of the deviation of the image plane with respect to the focal plane of the optical sensor.

21. A semiconductor device manufactured by a method wherein deviations of different surface zones of a wafer from a reference plane of a sensor are detected, wherein an image of a pattern is projected onto the surface zones of the wafer sequentially through a projection optical system while sequentially bringing the surface zones of the wafer into coincidence with an image plane of the projection optical system in accordance with the detected deviations, and wherein a first surface zone of the wafer is brought into coincidence with the image plane of the projection optical system and then the image of the circuit pattern is projected upon the first surface zone through the projection optical system, said method comprising the steps of:

after the image projection to the first surface zone, moving a second surface zone of the wafer, adjacent to the first surface zone, to a position close to the reference plane of the sensor;

detecting a deviation of the second surface zone from the reference plane;

bringing the second surface zone into coincidence with the reference plane of the sensor, on the basis of the detection; and moving, after said bringing step, the second surface zone along an optical axis of the projection optical system in accordance with an amount which is predetermined on the basis of the deviation of the image plane with respect to the reference plane of the sensor.

22. A method of bringing a surface of a wafer into coincidence with an image plane of a projection optical system on the basis of detection of the deviation of the wafer surface from a reference plane of a deviation detecting sensor, comprising:
- a first moving step for moving the wafer surface to a position close to the reference plane;
- a detecting step for detecting the deviation of the wafer surface from the reference plane; and
- a second moving step for moving the wafer surface along an optical axis of the projection optical system on the basis of the detected deviation by an amount which is predetermined on the basis of the deviation of the image plane with respect to the reference plane of the deviation detecting sensor.

23. A method according to claim 22, wherein said second moving step comprises the step of correcting any inclination of the wafer surface in accordance with the detected deviation after said detecting step.

24. A method used in manufacturing semiconductor devices by bringing a surface of a wafer into coincidence with an image plane of a projection optical system on the basis of detection of the deviation of the wafer surface from a reference plane of a deviation detecting sensor and by projecting an image of a pattern upon the wafer through the projection optical system, comprising:
- a first step of moving the wafer surface to a position close to the reference plane and detecting the deviation of the wafer surface from the reference plane; and
- a second step of moving the wafer surface along an optical axis of the projection optical system in accordance with the detected deviation by an amount which is predetermined on the basis of the deviation of the image plane with respect to the reference plane of the deviation detecting sensor.

25. A method according to claim 24, wherein said second moving step comprises the step of correcting any inclination of the wafer surface in accordance with the detected deviation after said detecting step.

26. A method of bringing a surface of a wafer into coincidence with an image plane of a projection optical system on the basis of the detection of deviations of the wafer surface, at different points thereon, from a reference plane of a deviation detecting optical sensor, comprising:
- a first moving step for moving the wafer surface to a position close to the reference plane of the optical sensor;
- a detecting step for detecting deviations at the different points of the wafer surface from the reference plane; and
- a second moving step for moving the wafer surface along an optical axis of the projection optical system in accordance with the detected deviation by an amount which is predetermined on the basis of the deviation of the image plane with respect to the reference plane of the deviation detecting sensor.

27. A method according to claim 26, wherein said second moving step comprises the step of correcting any inclination of the wafer surface in accordance with the detected deviation after said detecting step.

28. A method according to claim 26, wherein, in an initial state, the wafer surface is between the image plane and the reference plane or at a side of the image plane remote from the reference plane.

29. A method used in manufacturing semiconductor devices by bringing a surface of a wafer into coincidence with an image plane of a projection optical system on the basis of detection of deviations of the wafer surface, at different points thereon, from a reference plane of a deviation detecting optical sensor, and by projecting an image of a pattern upon the wafer surface through the projection optical system, comprising:
- a first moving step for moving the wafer surface to a position close to the reference plane of the optical sensor;
- a detecting step for detecting deviations at the different points of the wafer surface from the reference plane; and
- a second moving step for moving the wafer surface along an optical axis of the projection optical system in accordance with the detected deviation by an amount which is predetermined on the basis of the deviation of the image plane with respect to the reference plane of the deviation detecting sensor.

30. A method according to claim 29, wherein said second moving step comprises the step of correcting any inclination of the wafer surface in accordance with the detected deviation after said detecting step.

31. A method used in manufacturing semiconductor devices by detecting deviations of different surface zones of a wafer from a reference plane of a sensor and by projecting an image of a pattern sequentially onto the surface zones of the wafer through a projection optical system while sequentially bringing the surface zones of the wafer into coincidence with an image plane of the projection optical system in accordance with the detected deviations, wherein a first surface zone of the wafer is brought into coincidence with the image plane of the projection optical system and then the image of the circuit pattern is projected upon the first surface zone through the projection optical system, said method comprising the steps of:
- after the image projection to the first surface zone, moving a second surface zone of the wafer, adjacent to the first surface zone, to a position close to the reference plane of the sensor;
- detecting a deviation of the second surface zone from the reference plane; and
- moving the second surface zone along an optical axis of the projection optical system in accordance with the detected deviation by an amount which is predetermined on the basis of the deviation of the image plane with respect to the reference plane of the deviation detecting sensor.

32. A method according to claim 31, wherein, after the image projection onto the second surface zone, said method comprises the step of sequentially repeating said moving, detecting, coincidence attainment, and image projection steps for the remaining surface zones of the wafer.

33. A method according to claim 31, further comprising the steps of using the sensor to detect the deviation optically, and using a focal plane of the sensor as the reference plane.

34. A semiconductor device manufactured by a method wherein a surface of a wafer is brought into coincidence with an image plane of a projection optical system on the basis of the detection of the deviation of the wafer surface from a reference plane of a deviation detecting sensor and wherein an image of a pattern is projected on the wafer through the projection optical system, said method comprising the steps of:

moving the wafer surface to a position close to the reference plane and detecting the deviation of the wafer surface from the reference plane; and moving the wafer surface along an optical axis of the projection optical system in accordance with the detected deviation by an amount which is predetermined on the basis of the deviation of the image plane with respect to the reference plane of the deviation detection sensor.

35. A semiconductor device manufactured by a method, wherein a surface of a wafer is brought into coincidence with an image plane of a projection optical system on the basis of the detection of deviations of the wafer surface, at different points thereon, from a reference plane of a deviation detecting optical sensor and wherein an image of a pattern is projected on the wafer surface through the projection optical system, said method comprising the steps of:

moving the wafer surface to a position close to the reference plane and detecting the deviation of the wafer surface from the reference plane; and moving the wafer surface along an optical axis of the projection optical system in accordance with the detected deviation by an amount which is predetermined on the basis of the deviation of the image plane with respect to the reference plane of the deviation detecting sensor.

\* \* \* \* \*

UNITED STATES PATENT AND TRADEMARK OFFICE
CERTIFICATE OF CORRECTION

PATENT NO. : 5,323,016            Page 1 of 2
DATED : June 21, 1994
INVENTOR(S) : YUICHI YAMADA, et al.

It is certified that error appears in the above-indentified patent and that said Letters Patent is hereby corrected as shown below:

ON COVER PAGE:

At [56] Under Heading "U.S. PATENT DOCUMENTS":
    Line 1, "Mizertanie t al." should read --Mizertanie et al.--.

IN THE DRAWINGS:
    Sheet 5 of 5, In Step 609, "PRJECTION" should read --PROJECTION--.

COLUMN 3:
    Line 25, "plane, ,or" should read --plane or--.

COLUMN 4:
    Line 20, "or the" should be deleted.

COLUMN 8:
    Line 18, "al" should read --as--.

UNITED STATES PATENT AND TRADEMARK OFFICE
CERTIFICATE OF CORRECTION

PATENT NO. : 5,323,016
DATED : June 21, 1994
INVENTOR(S) : Yuichi Yamada, et al

It is certified that error appears in the above-indentified patent and that said Letters Patent is hereby corrected as shown below:

COLUMN 13:

Line 12, "wherein," should read --wherein, at--.
Line 35, delete "and".

Signed and Sealed this

Fifth Day of March, 1996

Attest:

BRUCE LEHMAN

*Attesting Officer*   *Commissioner of Patents and Trademarks*